(12) United States Patent
Mejri

(10) Patent No.: US 6,756,851 B2
(45) Date of Patent: Jun. 29, 2004

(54) TRANSIMPEDANCE AMPLIFIER

(75) Inventor: Jaafar Mejri, Ottobrunn (DE)

(73) Assignee: Infineon Technology AG, Munich (DE)

( * ) Notice: Subject to any disclaimer, the term of this patent is extended or adjusted under 35 U.S.C. 154(b) by 0 days.

(21) Appl. No.: 10/372,012

(22) Filed: Feb. 21, 2003

(65) Prior Publication Data

US 2003/0160659 A1 Aug. 28, 2003

(30) Foreign Application Priority Data

Feb. 26, 2002 (DE) .......................................... 102 08 117

(51) Int. Cl.[7] .............................. H03F 3/04; H03F 1/24
(52) U.S. Cl. ........................... 330/289; 330/98; 330/99; 330/100
(58) Field of Search ........................... 330/289, 98, 99, 330/100

(56) References Cited

U.S. PATENT DOCUMENTS

| | | | | |
|---|---|---|---|---|
| 5,015,836 A | * | 5/1991 | Van Antwerp | 250/205 |
| 5,105,165 A | * | 4/1992 | Bien | 330/149 |
| 5,606,277 A | * | 2/1997 | Feliz | 327/311 |
| 5,844,445 A | * | 12/1998 | Takeyari | 330/293 |
| 5,986,481 A | * | 11/1999 | Kaminishi | 327/96 |

FOREIGN PATENT DOCUMENTS

DE          195 13 225 C2    2/2002

OTHER PUBLICATIONS

Michael P. Cook et al., *"Integrated Circuits for a 200–Mbits/s Fiber–Optic Link"*, IEEE Journal of Solid-State Circuits, vol. SC 21, No. 6, Dec. 1986, pp. 909–915.
Alan B. Brebene: Bipolar and MOS analog integrated circuit design, New York, 1984, pp. 424 and 431.

* cited by examiner

*Primary Examiner*—Patricia Nguyen
(74) *Attorney, Agent, or Firm*—Workman Nydegger

(57) ABSTRACT

Transimpedance amplifier having an input stage (1) to which an input current to be amplified is fed and an output stage (2) which outputs an output voltage ($u_o$) corresponding to the amplified input current. By means of a current control circuit (4) the current ($I_c$) flowing through the amplifying element ($Q_1$) of the input stage (1) is detected and controlled in such a way that said current is independent of the ambient temperature and of the supply voltage ($V_{cc}$). To detect the current ($I_c$) a dummy transimpedance amplifier (5) is used in combination with a current mirror circuit (6), the current ($I_c$) being controlled in that the control voltage ($U_c$) of a further transistor ($Q_c$) coupled to the amplifying element ($Q_1$) configured as a transistor is adjusted accordingly.

10 Claims, 2 Drawing Sheets

TRANSIMPEDANCE AMPLIFIER

CROSS-REFERENCE TO RELATED APPLICATIONS

This application claims priority to German application No. DE 102 08 117.4, filed Feb. 26, 2002, which application is incorporated herein by specific reference.

BACKGROUND OF THE INVENTION

1. The Field of the Invention

The present invention relates to a transimpedance amplifier of the kind used, for example, in an integrated preamplifier circuit of an optical receiver module in order to amplify and convert into voltage the data signals transmitted via an optical waveguide and converted into corresponding current pulses by a photodiode.

2. The Relevant Technology

FIG. 3 shows by way of example the structure of a conventional transimpedance amplifier. The transimpedance amplifier includes an input stage 1 and an output stage 2 coupled thereto. The input stage 1 includes as the amplifying element a bipolar transistor $Q_1$ the collector of which is connected to a supply voltage $V_{cc}$ via a resistor $R_c$. The output stage 2 likewise includes an amplifying element $Q_2$ in the form of a bipolar transistor the collector of which is connected to the supply voltage $V_{cc}$. The base of the transistor $Q_2$ is connected to the collector of the transistor $Q_1$. An input signal in the form of an input current is fed to the base of transistor $Q_1$ while an amplified output voltage $u_o$ can be tapped at the emitter of transistor $Q_2$ via an emitter resistor $R_e$. The voltage applied to the base of transistor $Q_1$ is designated $u_i$, reference being made below to the voltage $u_i$ with regard to the calculation of operating points and for quantification of the voltage/voltage amplification of the non-back-coupled amplifier (Open Loop Amplification). The base of transistor $Q_1$ of the input stage 1 therefore forms an input connection of the transimpedance amplifier, while the emitter of transistor $Q_2$ of the output stage 2 represents an output connection of the transimpedance amplifier, said output connection being back-coupled via a feedback loop 3 including a transimpedance resistor $R_t$ to the input connection or the base of transistor $Q_1$. A feedback current corresponding to the output voltage $u_o$ is therefore supplied to the base of transistor $Q_1$ via said transimpedance resistor $R_t$.

The feedback effected by the transimpedance resistor $R_t$ serves to set an operating point of the transimpedance amplifier which is as stable as possible, the current/voltage amplification of the transimpedance amplifier being determined by the value of the transimpedance resistor $R_t$. The open loop amplification $A_{ol}$ of the transimpedance amplifier shown in FIG. 3 is calculated as follows:

$$A_{ol} = \frac{u_o}{u_i} \quad (1)$$
$$= g_m \cdot R_c$$
$$= \frac{I_c}{U_t} \cdot R_c$$
$$= \frac{V_{cc} - 2 \cdot U_{be}}{R_c} \cdot \frac{1}{U_t} \cdot R_c = \frac{V_{cc} - 2 \cdot U_{be}}{U_t},$$

where $g_m$ denotes the transconductance of the amplifier, $U_{be}$ the base-emitter voltage of the transistors $Q_1$, $Q_2$ and $U_t$ the so-called temperature voltage, which is dependent on the ambient temperature. It can be seen from the above formula (1) that the open loop amplification of the transimpedance amplifier and therefore its frequency behaviour depend on the ambient temperature and the supply voltage. This dependence of the open loop amplification on ambient temperature and supply voltage can lead to instabilities in the amplifier circuit when there is feedback, since the supply voltage and ambient temperature can fluctuate, depending on the application concerned.

A possible solution to the above-mentioned problem consists in dimensioning the transimpedance amplifier in such a way that the desired bandwidth can be achieved at all possible temperature and supply voltage values. To achieve this with regard to bandwidth, however, overdimensioning of the transimpedance amplifier is required, which is disadvantageous with regard both to the noise properties and to the stability of the transimpedance amplifier.

Known from "Integrated Circuits for a 200-Mbit/s Fiber-Optic Link", Michael P. Cook, Geoff W. Sumerling, Tran van Muoi, Andy C. Carter, IEEE Journal of Solid State Circuits, vol. SC-21, No. 6, December 1986, pages 909–915 is a transimpedance amplifier for a preamplifier circuit in a receiver module of an optical data transmission network, said transimpedance amplifier having a cascode circuit between the input and output stages. The cascode current flowing via this cascode circuit is indirectly monitored via an identically structured dummy cascode circuit and converted into a corresponding voltage by means of a resistor connected in series thereto, which voltage is in turn compared to a reference voltage dependent on ambient temperature. The bias voltage of the transimpedance amplifier, which thus influences the cascode current, is controlled as a function of the result of the comparison. In this way the cascode current can be adjusted proportionally to the absolute temperature, so that the dynamic impedance of the base-emitter diode of the bipolar transistor of the input stage can be kept constant and an amplification of the transimpedance amplifier independent of ambient temperature can be achieved.

However, through the use of the cascode circuit the control concept of the above-described transimpedance amplifier is associated with a relatively high implementation cost, because, among other reasons, additional circuit sections for applying the bias voltage to the cascode circuit are required. In addition, in this known transimpedance amplifier, the operating point setting (biasing) of the dummy cascode circuit is effected by using voltages of the active transimpedance stage, which is detrimental to the frequency behaviour of this stage.

BRIEF SUMMARY OF THE INVENTION

It is therefore the object of the present invention to propose a transimpedance amplifier whereby the above-described disadvantages are eliminated and whereby (open loop) amplification of the transimpedance amplifier independent of temperature and supply voltage fluctuations can be achieved at low implementation cost.

It is proposed according to the invention, by means of a suitable current control circuit, to detect the current flowing via the amplifying element or the bipolar transistor of the input stage and to control said current in such a way that it is independent of the ambient temperature. At the same time, it can thereby be achieved that the current controlled is independent of fluctuations of the supply voltage.

To achieve the above-mentioned effect the current flowing in the input stage can be used suitably to control the control or base voltage of a bipolar transistor coupled to the amplifying element of the input stage.

Because direct measurement of the current flowing in the input stage would be detrimental to the frequency behaviour of the transimpedance amplifier a dummy amplifier (replica amplifier) which emulates the behaviour of the whole transimpedance amplifier is preferably used, in which case, instead of the current flowing in the input stage of the transimpedance amplifier itself, the current flowing in the input stage of the dummy amplifier connected in parallel thereto is detected and used to control the current flowing in the input stage of the actual transimpedance amplifier. Detection of the current flowing in the input stage of the dummy amplifier is effected preferably by means of a current mirror circuit.

The transimpedance amplifier according to the invention can be used, for example, in a preamplifier circuit of an optical receiver module, whereby the data or information signals received by a photodiode via an optical waveguide in case of large bandwidths can, by means of a preamplifier circuit of this kind, be amplified and converted into voltage for further processing.

Because, in the case of the transimpedance amplifier according to the invention, an operating point setting once selected is valid for all possible temperature and supply voltage values, a significant reduction in design time can be achieved. To take account of extreme operating conditions, at most a small overdimensioning with regard to bandwidth is required. Because of the reduced overdimensioning of bandwidth an improvement in the sensitivity and stability of the transimpedance amplifier circuit can be achieved.

Unlike the case with the above-mentioned conventional transimpedance amplifier circuit, no cascode circuits are required, so that the circuit structure can be simplified and circuit complexity reduced. The biasing circuit stages otherwise required for a cascode circuit can be omitted. Because a replica of the whole amplifier stage is used as a dummy for current measurement, no internal nodal points are required in the active amplifier stage for current measurement, so that greater bandwidth and higher operating speed can be achieved. In addition, in comparison to the conventional transimpedance amplifier, which necessitates a cascode circuit, operation with smaller supply voltages is possible.

Because of the above-mentioned advantages of the transimpedance amplifier according to the invention, greater security in the design of the circuit can be achieved.

BRIEF DESCRIPTION OF THE DRAWINGS

The present invention is elucidated below with reference to the appended drawings and to a preferred embodiment.

DETAILED DESCRIPTION OF THE PREFERRED EMBODIMENTS

Figure 1:
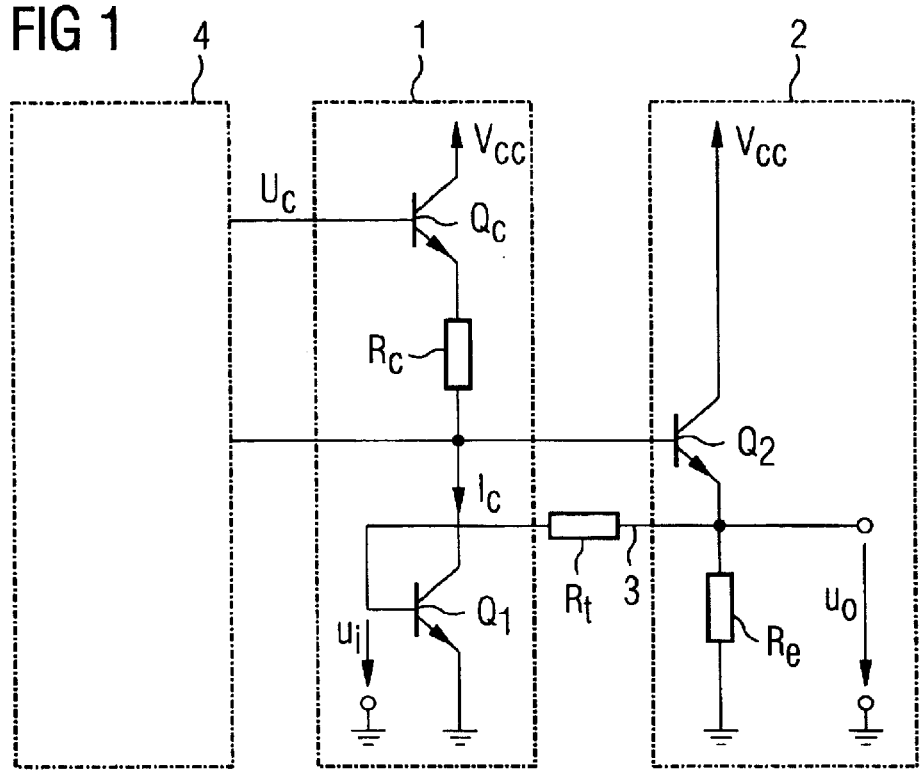
FIG. 1 shows an embodiment of a transimpedance amplifier according to the present invention.
Figure 3:
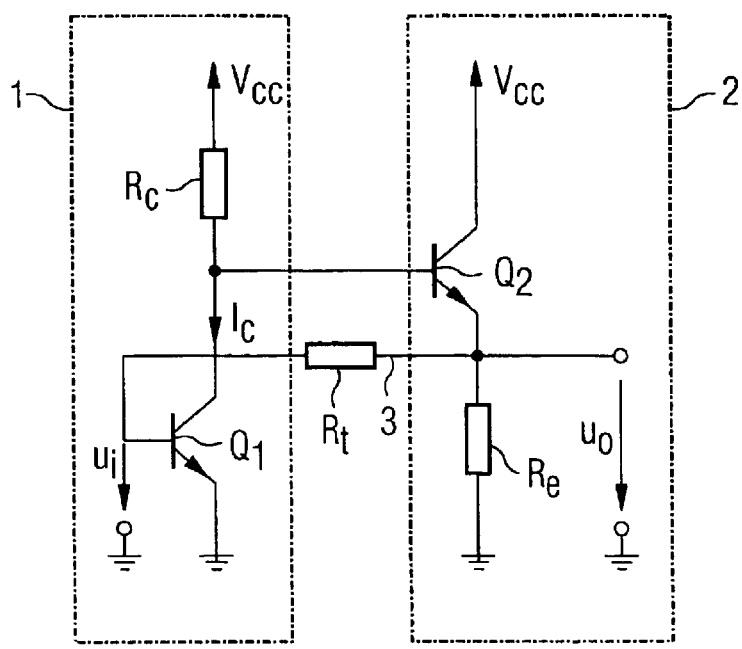
FIG. 3 shows a known transimpedance amplifier according to the state of the art.

In the embodiment shown in FIG. 1 the components corresponding to the components shown in FIG. 3 are denoted by the same reference symbols; to avoid unnecessary repetition reference is made regarding these components to the explanations relating to FIG. 3.

The structure of the transimpedance amplifier shown in FIG. 1 corresponds substantially to the transimpedance amplifier shown in FIG. 3, a further bipolar transistor $Q_c$ being, however, connected between the supply voltage $V_{cc}$ and the collector resistor $R_c$ of the input stage 1, the base voltage $u_c$ of said transistor $Q_c$ being set by a control circuit 4 in order to control the current $I_c$ flowing through the transistor $Q_1$.

To compensate the dependence of the open loop amplification of the transimpedance amplifier on temperature and supply voltage, the current $I_c$ flowing through the transistor $Q_1$ must be controlled proportionally to temperature, i.e. the temperature coefficient of the temperature voltage $U_t$ must be compensated. In the circuit shown in FIG. 1 the following relationship obtains for the open loop amplification $A_{ol}$ of the transimpedance amplifier:

$$A_{ol} = \frac{U_c - 3 \cdot U_{be}}{U_t}. \tag{2}$$

The base voltage $U_c$ of the transistor $Q_c$ must therefore be controlled in such a way that the temperature coefficients of the base-emitter voltage $U_{be}$ and the temperature voltage $U_t$ can be compensated, while at the same time a current $I_c$ independent of fluctuations of the supply voltage $V_{cc}$ can be achieved. It will be pointed out in addition that statements on the behaviour of the amplifier with feedback can be made on the basis of a quantification of the open loop amplification, i.e. the voltage/voltage amplification of the non-back-coupled amplifier.

To control the base voltage $U_c$ of the transistor $Q_c$ and the current $I_c$ through the transistor $Q_1$, respectively, direct measurement of current is not carried out, as this would be detrimental to the frequency behaviour of the transimpedance amplifier. Rather, a dummy amplifier stage, via which the current $I_c$ can be detected, is used to emulate the behaviour of the whole transimpedance amplifier. A corresponding realisation in terms of circuit technology is shown in FIG. 2.

Figure 2:
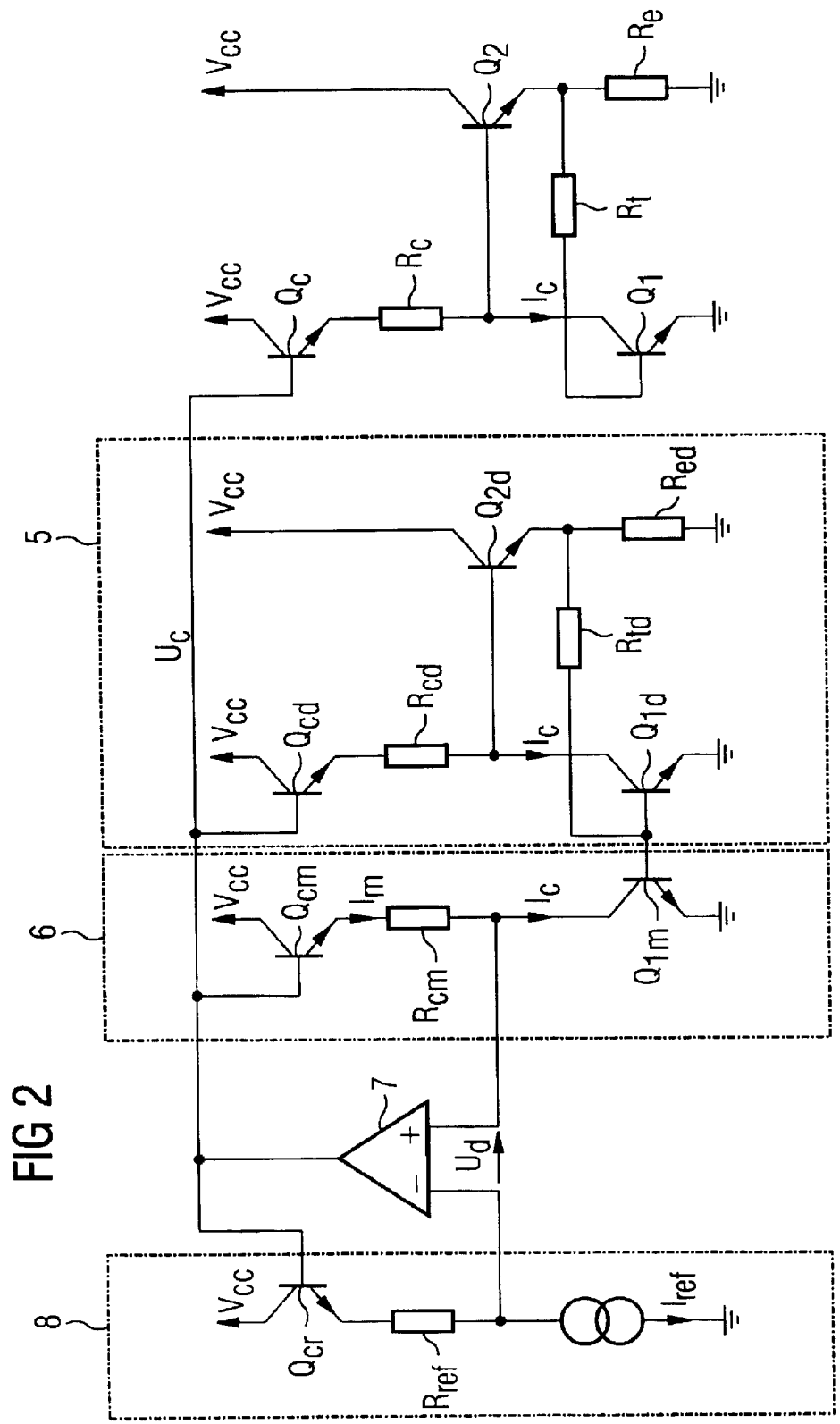
FIG. 2 shows a possible realisation of the transimpedance amplifier shown in FIG. 1 in terms of circuit technology.

In FIG. 2 the dummy amplifier, which is structured identically to the actual transimpedance amplifier, is denoted by reference numeral 5. The dummy amplifier 5 accordingly comprises bipolar transistors $Q_{cd}$, $Q_{1d}$ and $Q_{2d}$, which correspond to transistors $Q_c$, $Q_1$ and $Q_2$ of the transimpedance amplifier. Likewise, a collector resistor $R_{cd}$ corresponding to the collector resistor $R_c$ and a transimpedance resistor $R_{td}$ corresponding to the transimpedance resistor $R_t$ are provided in the dummy amplifier 5. An equivalent emitter resistor $R_{ed}$ for the emitter resistor $R_e$ of the transistor $Q_2$ of the output stage of the transimpedance amplifier is also contained in the dummy amplifier 5.

Direct measurement of voltage at the collector of the transistor $Q_{1d}$ of the dummy amplifier 5 would lead in all cases, i.e. unchangeably, to a measurement result of $2U_{be}$. For this reason the current $I_c$ flowing through the transistor $Q_{1d}$ is measured, a current mirror 6 having bipolar transistors $Q_{cm}$ and $Q_{1m}$ between which is connected a collector resistor $R_{cm}$ being used for this purpose. The transistors $Q_1$, $Q_{1d}$ and $Q_{1m}$ have the same properties, in order to ensure an equally large collector current $I_c$ through the respective transistor. Likewise, the transistors $Q_c$, $Q_{cd}$ and $Q_{cm}$ have the same properties and the resistors $R_c$, $R_{cd}$ and $R_{cm}$ have the same resistance value. The use of the current mirror 6, which is structured identically to the input stage of the transimpedance amplifier and to the input stage of the dummy amplifier 5, therefore makes possible reliable detection of the collector current $I_c$ flowing via the transistor $Q_{1d}$ or the transistor $Q_1$. The current measurement is carried out indirectly via detection of the voltage drop at the resistor $R_{cm}$, which is proportional to the current $I_m$ flowing through this resistor, which current in turn corresponds approximately to the collector current $I_c$.

The actual control of the base voltage $U_c$ of the transistor $Q_c$, i.e. control of the collector current $I_c$ proportional thereto, is effected by a differential amplifier 7 acting as a controller, the positive input of which is connected to the nodal point between the resistor $R_{cm}$ and the transistor $Q_{1m}$ of the current mirror 6. The negative input of this controller 7 receives a reference voltage which has been generated by a reference voltage generating circuit 8. This reference voltage generating circuit 8 comprises a bipolar transistor $Q_{cr}$ the collector of which is connected to the supply voltage $V_{cc}$, the emitter of this transistor being connected via a resistor $R_{ref}$ to a current source which generates a reference current $I_{ref}$. The negative input of the controller 7 is connected to the nodal point between the resistor $R_{ref}$ and the current source. The base of the transistor $Q_{cr}$—like those of the transistors $Q_{cm}$, $Q_{cd}$ and $Q_c$—is connected to the output of the controller 7. The controller 7 and the reference voltage generating circuit 8 can therefore be allocated to the control circuit 4 shown in FIG. 1.

In the stable, i.e. the adjusted state of the circuit arrangement shown in FIG. 2 the following relationships obtain:

$$U_d = 0 \qquad (3)$$

$$U_c - U_{becr} - I_{ref} R_{ref} = U_c - U_{becm} - I_m \cdot R_{cm} \qquad (4)$$

$$I_m \approx I_c = \frac{R_{ref}}{R_{cm}} \cdot I_{ref}, \qquad (5)$$

where $U_d$ denotes the differential voltage between the two inputs of the controller 7, $U_{becr}$ the base-emitter voltage of the transistor $Q_{cr}$ and $U_{becm}$ the base-emitter voltage of the transistor $Q_{cm}$.

It can be seen from formula (5) that the current $I_c$ flowing through the amplifier transistor $Q_1$ of the input stage of the transimpedance amplifier depends only on the reference current $I_{ref}$; in contrast, the dependences on the supply voltage $V_{cc}$, on the base-emitter voltage and on the temperature voltage of the transistors have been eliminated. If the reference current $I_{ref}$ is configured as an ambient-temperature-dependent PTAT current (Proportional to Absolute Temperature), the open loop amplification of the transimpedance amplifier as a whole can be made independent of temperature. Because the resistor $R_{cm}$ is a component of a positive feedback of the controller or error amplifier 7 the resistance value of this resistor should be so selected that $R_{ref} < R_{cm}$ obtains.

What is claimed is:

1. A transimpedance amplifier comprising:
   a. an input stage, said input stage having a first amplifying element and an input connection for receiving an input current;
   b. an output stage, said output stage having a second amplifying element and an output connection for outputting an output voltage corresponding to the amplified input current, the output stage being connected to a downstream side of the input stage and the output connection of the output stage being back-coupled to the input connection of the input stage via a feedback loop; and
   c. a current control circuit for detecting and controlling a current flowing through the first amplifying element of the input stage in such a way that said current is independent of ambient temperature.

2. A transimpedance amplifier according to claim 1, wherein the first amplifying element is a first transistor having a first and a second signal connection and a control connection and the second amplifying element is a second transistor having a first and a second signal connection and a control connection, the control connection of the first transistor corresponding to the input connection of the transimpedance amplifier and the second signal connection of the second transistor corresponding to the output connection of the transimpedance amplifier, the first transistor and the second transistor being connected with their first and second signal connections between a first supply voltage and a second supply voltage, and the first signal connection of the first transistor being connected to the control connection of the second transistor.

3. A transimpedance amplifier according to claim 2, wherein the current control circuit is so configured that it controls the current flowing through the first transistor by controlling a control voltage, the control voltage being supplied to a control connection of a third transistor which is so connected to a first and a second signal connection in series with the first transistor that the serial circuit comprising the first transistor and the third transistor is connected between the first supply voltage and the second supply voltage.

4. A transimpedance amplifier according to claim 1, further comprising a dummy transimpedance amplifier for emulating the behaviour of the transimpedance amplifier is provided, said dummy transimpedance amplifier being structured analogously to the transimpedance amplifier and the current flowing via a first amplifying element of the dummy impedance amplifier corresponding to the first amplifying element of the input stage of the transimpedance amplifier being detected in order to control the current flowing through said first amplifying element of the input stage of the transimpedance amplifier.

5. A transimpedance amplifier according to claim 4, further comprising a current mirror circuit, and wherein the current flowing via the first amplifying element of the dummy transimpedance amplifier is detected by the current control circuit via the current mirror circuit.

6. A transimpedance amplifier according to claim 5, wherein the current mirror circuit is structured analogously to the input stage of the dummy transimpedance amplifier.

7. A transimpedance amplifier according to claim 3, further comprising a dummy transimpedance amplifier for emulating the behavior of the transimpedance amplifier, said dummy transimpedance amplifier being structured analogously to the transimpedance amplifier and the current flowing via a transistor of the dummy impedance amplifier corresponding to the first transistor of the input stage of the transimpedance amplifier being detected in order to control the current flowing through said first transistor of the input stage of the transimpedance amplifier, and the current flowing via the transistor of the dummy transimpedance amplifier corresponding to the first transistor of the input stage of the transimpedance amplifier is detected by the current control circuit via a current mirror circuit, whereby the current mirror circuit is structured analogously to the input stage of the dummy transimpedance amplifier, and the current mirror circuit includes a fourth transistor corresponding to the first transistor of the transimpedance amplifier and a fifth transistor corresponding to the third transistor of the transimpedance amplifier, said fourth and fifth transistors having in each case two signal connections and one control connection, the fourth transistor and the fifth transistor with their signal connections being connected in series between the first supply voltage and the second supply voltage, and the control connection of the fourth transistor being connected to a control connection of the transistor of the dummy transimpedance amplifier corresponding to the first transistor of the transimpedance amplifier, and the control connection of the fifth transistor being connected to the control connection of the third transistor of the transimpedance amplifier and to a control connection of a transistor of the dummy transimpedance amplifier corresponding to the third transistor.

8. A transimpedance amplifier according to claim 1, wherein the current control circuit compares the current flowing through the first amplifying element to a temperature-dependent reference value to effect the control.

9. A transimpedance amplifier according to claim 7, wherein the current control circuit compares the current flowing through the first transistor to a temperature-dependent reference value to effect the control and in that the current control circuit includes a controller which is connected by a first input to a nodal point between the fourth transistor and the fifth transistor and receives a temperature-dependent reference voltage at a second input as a temperature-dependent reference value, one output of the controller being connected to the control connection of the third transistor of the transimpedance amplifier.

10. An optical receiver for receiving optical signals transmitted via an optical transmission line, said optical receiver having a transimpedance amplifier according to claim 1 for amplifying the electrical signals corresponding to the received optical signals.

* * * * *